(12) United States Patent
Matsushita

(10) Patent No.: US 6,901,002 B2
(45) Date of Patent: May 31, 2005

(54) FERROELECTRIC MEMORY

(75) Inventor: Shigeharu Matsushita, Katano (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/768,018

(22) Filed: Feb. 2, 2004

(65) Prior Publication Data
US 2004/0151019 A1 Aug. 5, 2004

(30) Foreign Application Priority Data

Feb. 4, 2003 (JP) ........................................ 2003-027209

(51) Int. Cl.$^7$ ............................................. G11C 11/22
(52) U.S. Cl. ........................ 365/145; 365/149; 365/205
(58) Field of Search ................................ 365/145, 149, 365/205

(56) References Cited

U.S. PATENT DOCUMENTS 5,666,305 A * 9/1997 Mihara et al. .............. 365/145

FOREIGN PATENT DOCUMENTS

JP    2002-251877    9/2002

* cited by examiner

Primary Examiner—Huan Hoang
(74) Attorney, Agent, or Firm—Arent Fox PLLC

(57) ABSTRACT

A ferroelectric memory capable of suppressing false data reading or the like by increasing a read margin is obtained. This ferroelectric memory comprises a circuit applying a read voltage $V_R$ to a first electrode and a detector capable of detecting the difference between electric capacitances $C_{f0}$ and $C_{f1}$ of a ferroelectric film when the potential difference of a second electrode corresponding to the difference between the electric capacitances $C_{f0}$ and $C_{f1}$ of the ferroelectric film is in excess of a detection limit voltage $V_S$. The electric capacitance $C_2$ of the second electrode is set to satisfy the following expression:

$$C_{f0} < C_2 \leq \tfrac{1}{2} \times \{(C_{f1}-C_{f0})V_R/V_S-(C_{f1}+C_{f0})\}.$$

22 Claims, 8 Drawing Sheets

FERROELECTRIC MEMORY

BACKGROUND OF THE INVENTION

1. Field of the Invention

The present invention relates to a ferroelectric memory, and more particularly, it relates to a ferroelectric memory having a ferroelectric capacitor.

2. Description of the Background Art

A ferroelectric memory has recently been watched with interest as a high-speed nonvolatile memory requiring low power consumption. Therefore, the ferroelectric memory is subjected to active research and development.

FIG. 11 is a representative circuit diagram of a most generally employed conventional 1T1C ferroelectric memory, and FIG. 12 is a sectional view corresponding to FIG. 11. Referring to FIGS. 11 and 12, element isolation regions 102 are formed on prescribed regions of the surface of a semiconductor substrate 101 in the structure of this conventional 1T1C ferroelectric memory. Source regions 103 and a drain region 104 are formed at prescribed intervals on an element forming region enclosed with the element isolation regions 102. Gate electrodes 106 constituting word lines WL are formed on channel regions located between the source regions 103 and the drain region 104 through gate insulator films 105. Each bit line (BL) 113 is electrically connected to the drain region 104.

Lower electrodes 109 are connected to the source regions 103 through plug electrodes 108. Upper electrodes 111 forming plate lines PL are formed on the lower electrodes 109 through ferroelectric films 110. The lower electrodes 109, the ferroelectric films 110 and the upper electrodes 111 constitute ferroelectric capacitors 112. The source regions 103 and the drain region 104, the gate insulator films 105 and the gate electrodes 106 constitute transistors 107. These transistors 107 function as switches for selecting memory cells 100. As shown in FIG. 11, each memory cell 100 is constituted of a single transistor 107 and a single ferroelectric capacitor 112. A memory having this memory cell structure is referred to as a 1T1C ferroelectric memory. The 1T1C ferroelectric memory, having a structure obtained by replacing storage capacitors with ferroelectric capacitors in a DRAM, allows utilization of a conventional DRAM design technique.

A simple matrix ferroelectric memory having memory cells each constituted of only a single ferroelectric capacitor is also developed in general. FIG. 13 is a circuit diagram of a conventional simple matrix ferroelectric memory, and FIG. 14 is a sectional view corresponding to FIG. 13. Referring to FIGS. 13 and 14, a ferroelectric film 202 is formed on each bit line (BL) 201. Each word line (WL) 203 is formed on the ferroelectric film 202 to intersect with the bit line 201. The bit line 201, the ferroelectric film 202 and the word line 203 constitute a ferroelectric capacitor 210. In the simple matrix ferroelectric memory, each memory cell 200 is constituted of only a single ferroelectric capacitor 210, as shown in FIG. 13. Therefore, the memory cells 200 can be reduced in size and highly integrated.

In data reading, however, each of the aforementioned 1T1C and simple matrix ferroelectric memories generally requires polarization inversion of changing the polarization direction of each ferroelectric film. Repetition of such polarization inversion disadvantageously results in polarization fatigue/deterioration such as reduction of remanence.

In general, therefore, an FET ferroelectric memory having a reading method causing no polarization inversion is developed. For example, Japanese Patent Laying-Open No. 2002-251877 discloses such an FET ferroelectric memory.

Also known as an FET ferroelectric memory is an MFIS-FET (metal ferroelectric insulator semiconductor-field effect transistor) ferroelectric memory or an MFMIS-FET (metal ferroelectric metal insulator semiconductor-field effect transistor) ferroelectric memory having ferroelectric capacitors formed on gate portions of transistors.

FIG. 15 is a circuit diagram showing a conventional one-transistor (FET) ferroelectric memory having memory cells formed by MFMIS-FETs, and FIG. 16 is a sectional view corresponding to FIG. 15. Referring to FIGS. 15 and 16, a well region 302 is formed on the surface of a semiconductor substrate 301 in this FET ferroelectric memory. Source regions 303 and a drain region 304 are formed on the surface of the well region 302 at prescribed intervals. Gate electrodes 306 are formed on channel regions located between the source regions 303 and the drain regions 304 through gate insulator films 305.

Word lines (WL) 308 are formed on the gate electrodes 306 through ferroelectric films 307. Each bit line (BL) 310 is electrically connected to the drain region 304. Plate lines (PL) 311 are connected to the source regions 303. Each source line (SL) 312 is connected to the well region 302. The gate electrodes 306, the ferroelectric films 307 and the word lines 308 constitute one-transistor ferroelectric capacitors 315. The source regions 303 and the drain region 304, the gate insulator films 305 and the gate electrodes 306 constitute transistors 309. In this case, each memory cell 300 has a structure obtained by forming a single ferroelectric capacitor 315 on a gate portion of a single transistor 309.

The aforementioned Japanese Patent Laying-Open No. 2002-251877 disclosing the FET ferroelectric memory proposes a reading method causing no polarization inversion utilizing the difference between electric capacitances resulting from different polarization states.

However, the aforementioned Japanese Patent Laying-Open No. 2002-251877 disclosing the FET ferroelectric memory discloses no method of increasing a read margin by increasing signal potential difference at the time of reading information of stored data "0" or "1". Therefore, the signal potential difference at the time of reading the information of the data "0" or "1" may be less than the minimum readable signal potential difference. This disadvantageously results in false data reading or the like.

SUMMARY OF THE INVENTION

An object of the present invention is to provide a ferroelectric memory capable of suppressing false data reading or the like by increasing a read margin.

A ferroelectric memory according to a first aspect of the present invention comprises a memory cell including a ferroelectric capacitor having a ferroelectric film capable of taking different electric capacitances $C_{f0}$ and $C_{f1}$ in an initial state and first and second electrodes formed to hold the ferroelectric film therebetween, a circuit applying a read voltage $V_R$ to the first electrode and a detector capable of detecting the difference between the electric capacitances $C_{f0}$ and $C_{f1}$ of the ferroelectric film when the potential difference of the second electrode corresponding to the difference between the electric capacitances $C_{f0}$ and $C_{f1}$ of the ferroelectric film is in excess of a detection limit voltage $V_S$, and the electric capacitance $C_2$ of the second electrode is set to satisfy the following expression:

$$C_{f0} < C_2 \leq \tfrac{1}{2} \times \{(C_{f1}-C_{f0})V_R/V_S-(C_{f1}+C_{f0})\}$$

In the aforementioned ferroelectric memory according to the first aspect, as hereinabove described, the electric capacitance $C_2$ of the second electrode is set to satisfy the above expression so that the potential difference of the second electrode corresponding to the difference between the electric capacitances $C_{f0}$ and $C_{f1}$ of the ferroelectric film can be in excess of the detection limit voltage $V_S$, whereby a read margin can be increased. Thus, false data reading or the like can be suppressed.

In the aforementioned ferroelectric memory according to the first aspect, the electric capacitance $C_2$ of the second electrode is preferably substantially expressed as follows:

$$C_2 = (C_{f1} \times C_{f0})^{1/2}$$

According to this structure, the potential difference of the second electrode corresponding to the difference between the electric capacitances $C_{f0}$ and $C_{f1}$ of the ferroelectric film can be so maximized that the read margin can be further increased.

In the aforementioned ferroelectric memory according to the first aspect, a voltage applied to the ferroelectric film is preferably less than a voltage causing polarization inversion of the ferroelectric film when holding data in a polarization direction opposite to the direction of application of the read voltage in data reading. According to this structure, the ferroelectric film can be prevented from polarization inversion in data reading while increasing the read margin. Thus, polarization fatigue/deterioration can be suppressed while increasing the read margin.

In this case, the voltage applied to the ferroelectric film may be greater than the voltage causing polarization inversion of the ferroelectric film when holding data in a polarization direction identical to the direction of application of the read voltage in data reading. Also when this structure is employed, the ferroelectric film is not subjected to polarization inversion in data reading, to cause no problem.

In the aforementioned ferroelectric memory according to the first aspect, the memory cell preferably includes a memory cell having the second electrode connected with a gate electrode of a transistor. According to this structure, it is possible to obtain a structure capable of increasing the read margin in an FET ferroelectric memory.

In the aforementioned ferroelectric memory including the memory cell having the second electrode connected with the gate electrode of the transistor, the detector preferably includes a current sense amplifier. According to this structure, the difference between the electric capacitances $C_{f0}$ and $C_{f1}$ of the ferroelectric film can be easily detected with the current sense amplifier in an FET ferroelectric memory.

In the aforementioned ferroelectric memory including the memory cell having the second electrode connected with the gate electrode of the transistor, the first electrode may be connected to a word line.

In the aforementioned ferroelectric memory according to the first aspect having the structure that the voltage applied to the ferroelectric film is less than the voltage causing polarization inversion of the ferroelectric film, the memory cell preferably includes a memory cell constituted of a ferroelectric capacitor consisting of the first electrode and the second electrode formed to extend in directions intersecting with each other and the ferroelectric film arranged between the first electrode and the second electrode. According to this structure, it is possible to obtain a structure capable of increasing the read margin with no polarization inversion in a simple matrix ferroelectric memory. Thus, false data reading or the like can be suppressed with no polarization inversion in the simple matrix ferroelectric memory.

In the aforementioned ferroelectric memory including the memory cell constituted of the ferroelectric capacitor consisting of the first electrode, the second electrode and the ferroelectric film, the detector includes a voltage sense amplifier. According to this structure, the difference between the electric capacitances $C_{f0}$ and $C_{f1}$ of the ferroelectric film can be easily detected with the voltage sense amplifier in a simple matrix ferroelectric memory.

In the aforementioned ferroelectric memory including the memory cell constituted of the ferroelectric capacitor consisting of the first electrode, the second electrode and the ferroelectric film, the first electrode may be a word line, and the second electrode may be a bit line.

In the aforementioned ferroelectric memory according to the first aspect having the structure that the voltage applied to the ferroelectric film is less than the voltage causing polarization inversion of the ferroelectric film, the memory cell preferably includes a memory cell having the second electrode connected to either a source region or a drain region of a transistor. According to this structure, it is possible to obtain a structure capable of increasing the read margin with no polarization inversion in a 1T1C ferroelectric memory. Thus, false data reading or the like can be suppressed with no polarization inversion in the 1T1C ferroelectric memory.

In the aforementioned ferroelectric memory including the memory cell having the second electrode connected to either the source region or the drain region of the transistor, the detector preferably includes a voltage sense amplifier. According to this structure, the difference between the electric capacitances $C_{f0}$ and $C_{f1}$ of the ferroelectric film can be easily detected with the voltage sense amplifier in the 1T1C ferroelectric memory.

In the aforementioned ferroelectric memory including the memory cell having the second electrode connected to either the source region or the drain region of the transistor, the first electrode may be connected to a plate line.

The aforementioned ferroelectric memory according to the first aspect may further comprise a row decoder selecting the first electrode corresponding to a row address, and the row decoder may include the circuit applying the read voltage $V_R$ to the first electrode.

In the aforementioned ferroelectric memory according to the first aspect, the initial state may be an initial state applying no voltage.

A ferroelectric memory according to a second aspect of the present invention comprises a memory cell including a ferroelectric capacitor having a ferroelectric film capable of taking different electric capacitances $C_{f0}$ and $C_{f1}$ in an initial state and first and second electrodes formed to hold the ferroelectric film therebetween, means applying a read voltage $V_R$ to the first electrode and detection means capable of detecting the difference between the electric capacitances $C_{f0}$ and $C_{f1}$ of the ferroelectric film when the potential difference of the second electrode corresponding to the difference between the electric capacitances $C_{f0}$ and $C_{f1}$ of the ferroelectric film is in excess of a detection limit voltage $V_S$, and the electric capacitance $C_2$ of the second electrode is set to satisfy the following expression:

$$C_{f0} < C_2 \leq \tfrac{1}{2} \times \{(C_{f1} - C_{f0})V_R/V_S - (C_{f1} + C_{f0})\}$$

In the aforementioned ferroelectric memory according to the second aspect, as hereinabove described, the electric capacitance $C_2$ of the second electrode is set to satisfy the above expression so that the potential difference of the second electrode corresponding to the difference between the electric capacitances $C_{f0}$ and $C_{f1}$ of the ferroelectric film can be in excess of the detection limit voltage $V_S$, whereby a read margin can be increased. Thus, false data reading or the like can be suppressed.

In the aforementioned ferroelectric memory according to the second aspect, the electric capacitance $C_2$ of the second electrode is preferably substantially expressed as follows:

$$C_2 = (C_{f1} \times C_{f0})^{1/2}$$

According to this structure, the potential difference of the second electrode corresponding to the difference between the electric capacitances $C_{f0}$ and $C_{f1}$ of the ferroelectric film can be so maximized that the read margin can be further increased.

In the aforementioned ferroelectric memory according to the second aspect, a voltage applied to the ferroelectric film is preferably less than a voltage causing polarization inversion of the ferroelectric film when holding data in a polarization direction opposite to the direction of application of the read voltage in data reading. According to this structure, the ferroelectric film can be prevented from polarization inversion in data reading while increasing the read margin. Thus, polarization fatigue/deterioration can be suppressed while increasing the read margin.

In the aforementioned ferroelectric memory according to the second aspect, the memory cell preferably includes a memory cell having the second electrode connected with a gate electrode of a transistor. According to this structure, it is possible to obtain a structure capable of increasing the read margin in an FET ferroelectric memory.

In the aforementioned ferroelectric memory according to the second aspect having the structure that the voltage applied to the ferroelectric film is less than the voltage causing polarization inversion of the ferroelectric film, the memory cell preferably includes a memory cell constituted of a ferroelectric capacitor consisting of the first electrode and the second electrode formed to extend in directions intersecting with each other and the ferroelectric film arranged between the first electrode and the second electrode. According to this structure, it is possible to obtain a structure capable of increasing the read margin with no polarization inversion in a simple matrix ferroelectric memory. Thus, false data reading or the like can be suppressed with no polarization inversion in the simple matrix ferroelectric memory.

In the aforementioned ferroelectric memory according to the second aspect having the structure that the voltage applied to the ferroelectric film is less than the voltage causing polarization inversion of the ferroelectric film, the memory cell preferably includes a memory cell having the second electrode connected to either a source region or a drain region of a transistor. According to this structure, it is possible to obtain a structure capable of increasing the read margin with no polarization inversion in a 1T1C ferroelectric memory. Thus, false data reading or the like can be suppressed with no polarization inversion in the 1T1C ferroelectric memory.

In the ferroelectric memory according to the second aspect, the initial state may be an initial state applying no voltage.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

Figure 1:
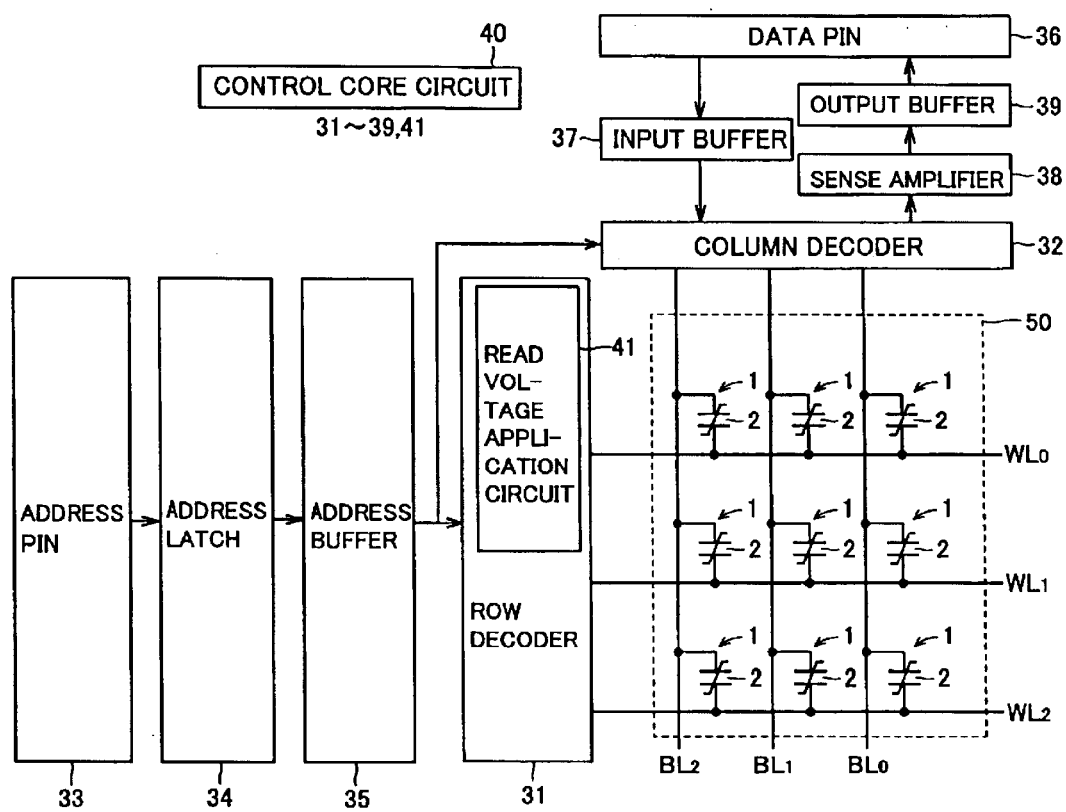
FIG. 1 is a circuit diagram showing the overall structure of a simple matrix ferroelectric memory according to a first embodiment of the present invention.

The overall structure of a simple matrix ferroelectric memory according to a first embodiment of the present invention is described with reference to FIG. 1. In the ferroelectric memory according to the first embodiment, a memory cell array 50 is constituted of a plurality of memory cells 1 arranged in the form of a matrix (for the convenience of illustration, FIG. 1 shows only nine memory cells 1). First terminals of ferroelectric capacitors 2 constituting the memory cells 1 are connected to word lines $WL_0$ to $WL_2$ while second terminals of the ferroelectric capacitors 2 are connected to bit lines $BL_0$ to $BL_2$. In other words, each memory cell 1 is constituted of only a single ferroelectric capacitor 2 in the first embodiment. Each ferroelectric capacitor 2 includes a ferroelectric film capable of taking different electric capacitances $C_{f0}$ and $C_{f1}$ in an initial state applying no voltage.

The word lines $WL_0$ to $WL_2$ are connected to a row decoder 31. The bit lines $BL_0$ to $BL_2$ are connected to a column decoder 32.

Externally specified row and column addresses are input in an address pin 33, which in turn transfers the row and column addresses to an address latch 34. The address latch 34 latching the row and column addresses transfers the row and column addresses to the row and column decoders 31 and 32 respectively through an address buffer 35.

The row decoder 31 selects the one corresponding to the row address latched by the address latch 34 from the word lines $WL_0$ to $WL_2$, and controls the potential of each word line WL in correspondence to an operation mode.

The column decoder 32 selects the one corresponding to the column address latched by the address latch 34 from the bit lines $BL_0$ to $BL_2$, and controls the potential of each bit line BL in correspondence to the operation mode.

According to the first embodiment, the row decoder 31 includes a read voltage application circuit 41 for applying a read voltage $V_R$ to the word lines $WL_0$ to $WL_2$ in data reading. This read voltage application circuit 41 is an example of the "means applying a read voltage $V_R$" in the present invention.

Externally specified data is input in a data pin 36, which in turn transfers the data to the column decoder 32 through an input buffer 37. The column decoder 32 controls the potentials of the bit lines $BL_0$ to $BL_2$ to levels corresponding to the data.

According to the first embodiment, data read from an arbitrary memory cell 1 is transferred from any of the bit lines $BL_0$ to $BL_2$ to a sense amplifier 38 through the column decoder 32. The sense amplifier 38 is a voltage sense amplifier. This sense amplifier 38 is an example of the "detection means capable of detecting the difference between the electric capacitances $C_{f0}$ and $C_{f1}$ of said ferroelectric film" in the present invention. The data determined by the sense amplifier 38 is output from an output buffer 39 through the data pin 36.

A control core circuit 40 controls operations of the aforementioned circuits 31 to 39 and 41.

Figure 2:
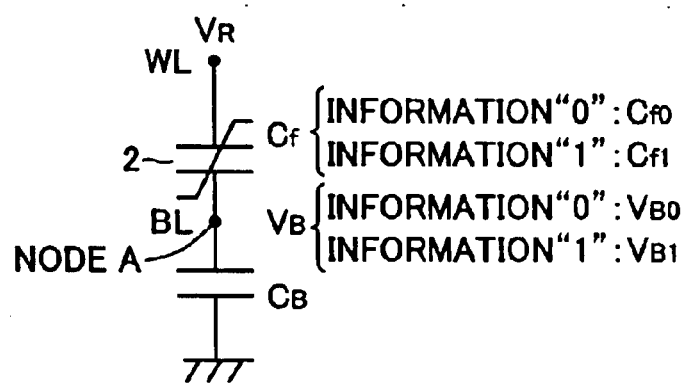
FIG. 2 is an equivalent circuit diagram for illustrating a data read operation of the ferroelectric memory according to the first embodiment shown in FIG. 1.

In each memory cell 1 including the ferroelectric capacitor 2 in the first embodiment, the ferroelectric capacitor 2 is constituted of a word line WL and a bit line BL extending to intersect with each other and a ferroelectric film held between the word line WL and the bit line BL, as shown in FIG. 2. In other words, the word line WL and the bit line BL function as a first electrode and a second electrode of the ferroelectric capacitor 2 respectively. The bit line BL has an electric capacitance (bit line capacitance) CB. The bit line capacitance $C_B$ is an example of the "electric capacitance $C_2$ of said second electrode" in the present invention.

A node A shown in FIG. 2 exhibits a potential VB ($V_{B0}$ or $V_{B1}$) appearing on the bit line BL. This node A is connected with means (the sense amplifier 38 in FIG. 1) detecting the difference between the potentials $V_{B0}$ and $V_{B1}$ appearing on the bit line BL.

Figure 3:
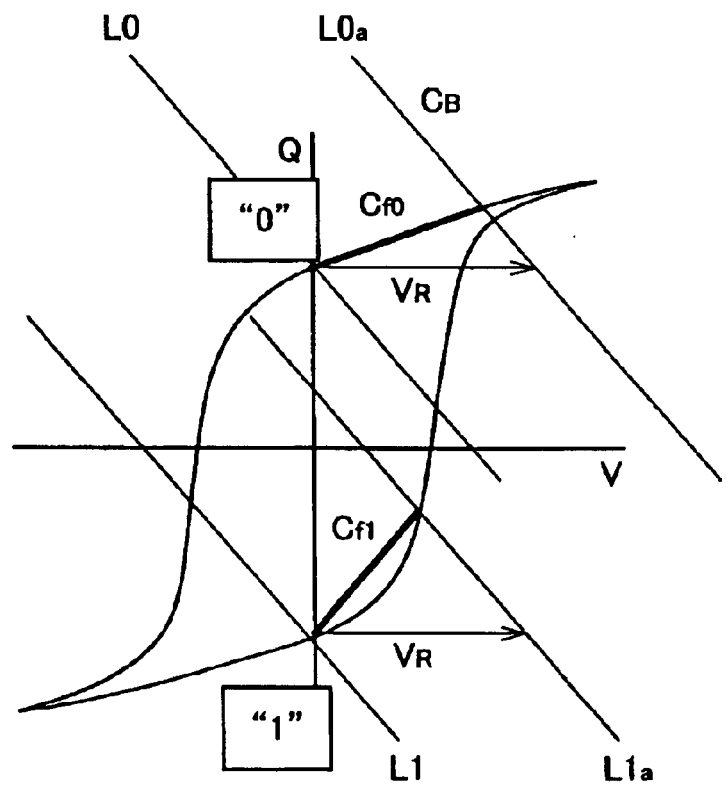
FIG. 3 is a characteristic diagram for illustrating the data read operation of the ferroelectric memory according to the first embodiment.

FIG. 3 shows the hysteresis of the ferroelectric capacitor 2. Referring to FIG. 3, the vertical axis shows the quantities Q of polarization charges held in the ferroelectric capacitor 2, and the horizontal axis shows voltages V applied to the ferroelectric capacitor 2. It is assumed that data is "0" when the ferroelectric capacitor 2 holds a quantity of charges having plus remanence and data is "1" when the ferroelectric capacitor 2 holds a quantity of charges having minus remanence. Symbol L0 denotes a load line of the bit line capacitance in a case where the ferroelectric capacitor 2 stores the data "0", and symbol $L0_a$ denotes a load line in a case of applying the read voltage $V_R$ to the word line WL from the state of the load line L0. Symbol L1 denotes a load line of the bit line capacitance in a case where the ferroelectric capacitor 2 stores the data "1", and symbol $L1_a$ denotes a load line in a case of applying the read voltage $V_R$ to the word line WL from the state of the load line L1.

A memory structure for increasing the read margin is now described with reference to FIGS. 2 and 3. It is assumed that symbols $C_{f0}$ and $C_{f1}$ ($C_{f1} > C_{f0}$) denote electric capacitances indicating rates of change of the charge quantities Q with respect to the data "0" and the data "1" when applying the read voltage $V_R$ to the word line WL respectively. It is also assumed that symbols $V_{B0}$ and $V_{B1}$ denote bit line potentials appearing on the node A upon application of the read voltage $V_R$ to the word line WL when the ferroelectric capacitor 2 holds the data "0" and the data "1" respectively. In this case, a read margin is increased when the potential difference ($V_{B1} - V_{B0}$) of the bit line BL is increased. The bit line potentials $V_{B0}$ and $V_{B1}$ in the case of holding the data "0" and in the case of holding the data "1" are expressed as follows respectively:

$$V_{B0} = C_{f0}/(C_{f0} + C_B) \times V_R \tag{1}$$

$$V_{B1} = C_{f1}/(C_{f1} + C_B) \times V_R \tag{2}$$

From the above expressions (1) and (2), the potential difference ($V_{B1} - V_{B0}$) appearing on the bit line when holding the data "0" and holding the data "1" respectively is expressed as follows:

$$\begin{aligned} V_{B1} - V_{B0} &= C_{f1}/(C_{f1} + C_B) \times V_R - C_{f0}/(C_{f0} + C_B) \times V_R \\ &= \{1/(1 + C_B/C_{f1}) - 1/(1 + C_B/C_{f0})\} \times V_R \\ &= \{(C_B/C_{f0} - C_B/C_{f1})/(1 + C_B/C_{f1}) \cdot \\ &\quad (1 + C_B/C_{f0})\} \times V_R \end{aligned} \tag{3}$$

Using X and K for $C_B/C_{f0}$ and $C_{f0}/C_{f1}$ respectively, the following expression holds:

$$KX = C_B/C_{f1}$$

Substituting these in the above expression (3), the following expression (4) is obtained:

$$\begin{aligned} V_{B1} - V_{B0} &= (1-K) \cdot X/(KX^2 + (1+K)X + 1) \times V_R \\ &= (1-K)/(KX + 1/X + (1+K)) \times V_R \end{aligned} \tag{4}$$

Applying the relation that the arithmetic mean is greater than or equal to the geometric mean (arithmetic mean ≧ geometric mean) to the denominator portion $KX + 1/X$ in the above expression (4), the following expression (5) is obtained:

$$(KX + 1/X)/2 \geq (KX \cdot 1/X)^{1/2} = K^{1/2}$$

$$KX + 1/X \geq 2K^{1/2} \tag{5}$$

Substituting the above expression (5) in the denominator portion $KX + 1/X$ in the above expression (4), the following expression (6) is obtained:

$$V_{B1} - V_{B0} \leq \{(1-K)/(2K^{1/2} + 1 + K)\} \times V_R \leq \{(1-K)/(1 + K^{1/2})^2\} \times V_R \tag{6}$$

In the above expression (6) having the denominator portion $KX + 1/X$, the symbol ≧ is inverted to ≦ due to the application of the relation that the arithmetic mean is greater than or equal to the geometric mean (arithmetic mean ≧ geometric mean). In the expression (6), the equal sign holds when the value KX is equal to the value 1/X (KX=1/X) due to the relation between the arithmetic mean and the geometric mean, and this expression is transformed as follows:

$$X = 1/K^{1/2}$$

Inserting the above relation of $X=C_B/C_{f0}$ and $K=C_{f0}/C_{f1}$ into the above expression, the following expression is obtained:

$$C_B/C_{f0} = 1/(C_{f0}/C_{f1})^{1/2}$$

Multiplying both members by the electric capacitance $C_{f0}$, the following expression is obtained:

$$C_B = (C_{f0} \cdot C_{f1})^{1/2}$$

Therefore, the equal sign in the expression (6) holds when the bit line capacitance $C_B$ is equal to $(C_{f0} \cdot C_{f1})^{1/2}$ (CB=$(C_{f0} \cdot C_{f1})^{1/2}$). From this relation, the maximum value of the difference $V_{B1}-V_{B0}$ is obtained by the following expression formed by inserting the expression $K=C_{f0}/C_{f1}$ into the expression (6) with application of $(C_{f0} \cdot C_{f1})^{1/2}$=CB:

$$\begin{aligned} V_{B1} - V_{B0} &= (1 - C_{f0}/C_{f1})/ \\ &\quad \{2(C_{f0}/C_{f1})^{1/2} + 1 + C_{f0}/C_{f1}\} \times V_R \\ &= (C_{f1} - C_{f0})/\{C_{f1} + C_{f0} + 2(C_{f0} \cdot C_{f1})^{1/2}\} \times V_R \\ &= (C_{f1} - C_{f0})/\{C_{f1} + C_{f0} + 2C_B\} \times V_R \end{aligned} \quad (7)$$

When the potential of the bit line connected to the node A is detected by means (the sense amplifier 38) capable of detecting potential difference exceeding the detection limit voltage $V_S$, the following expression (8) must be satisfied in order to reliably detect the difference $(V_{B1}-V_{B0})$ between the bit line potentials for the data "0" and the data "1" from the above expression (7):

$$V_{B1} - V_{B0} = (C_{f1} - C_{f0})/(C_{f1} + C_{f0} + 2C_B) \times V_R \geq V_S \quad (8)$$

From the above expression (8), a conditional expression necessary for the bit line capacitance $C_B$ is expressed as follows:

$$C_B \leq \tfrac{1}{2} \times \{(C_{f1} - C_{f0})V_R/V_S - (C_{f1} + C_{f0})\} \quad (9)$$

From the relation between the expressions $C_B=(C_{f0} \cdot C_{f1})^{1/2}$ and $C_{f0} > C_{f1}$, the bit line capacitance $C_B$ must also satisfy the following expression (10):

$$C_B > C_{f0} \quad (10)$$

From the expressions (9) and (10), therefore, the bit line capacitance $C_B$ must be set to satisfy the following expression (11), in order to reliably read the difference between the cases of the data "0" and the data "1" with the detection means (the sense amplifier 38) connected to the node A:

$$C_{f0} < C_B \leq \tfrac{1}{2} \times \{(C_{f1} - C_{f0})V_R/V_S - (C_{f1} + C_{f0})\} \quad (11)$$

Results of an experiment made under conditions satisfying the above expression (11) are now described.

Figure 4:
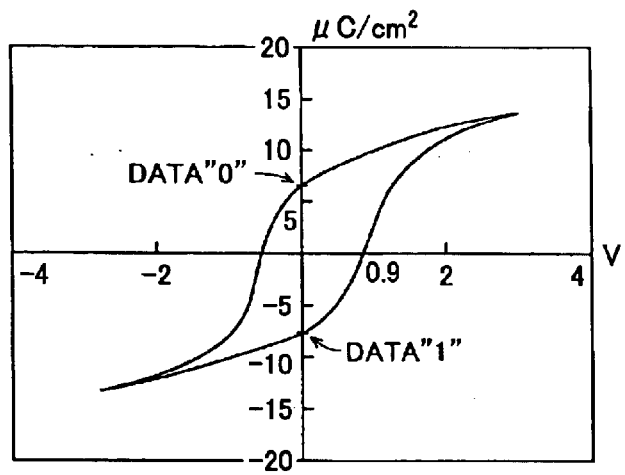
FIG. 4 illustrates the hysteresis of a ferroelectric capacitor employed in an experiment according to the first embodiment of the present invention.
Figure 5:
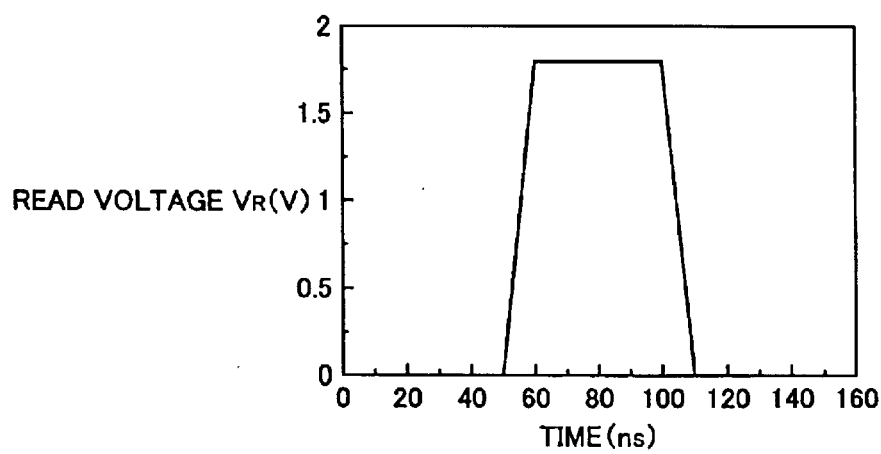
FIG. 5 illustrates a read voltage pulse in a read operation employed in the experiment according to the first embodiment of the present invention.
Figure 6:
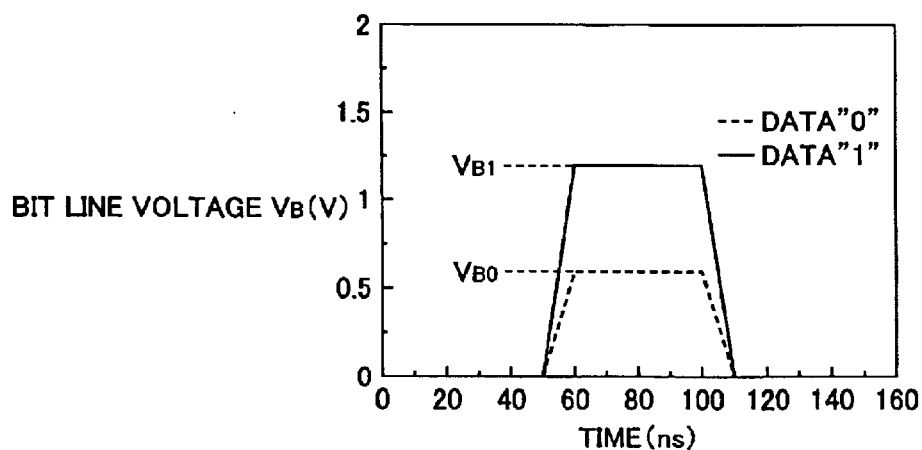
FIG. 6 illustrates the shapes of pulses generated on a bit line in the read operation in the experiment according to the first embodiment of the present invention.

FIG. 6 illustrates the shapes of pulses (bit line voltage $V_B$) generated on a bit line BL upon application of a read voltage ($V_R$=1.8 V) shown in FIG. 5 in cases of data "0" and data "1" in a simple matrix ferroelectric memory employing an SBT film ($SrBi_2Ta_2O_9$ film) having the hysteresis shown in FIG. 4 as a ferroelectric film. In this case, both of the bit line width and a word line width in the simple matrix ferroelectric memory were set to 1 μM.

Electric capacitances $C_{f0}$ and $C_{f1}$ of a ferroelectric capacitor for the data "0" and the data "1" and a bit line capacitance $C_B$ were set to 20 fF, 83 fF and 40 fF respectively. A detection limit voltage $V_S$ of detection means (sense amplifier 38) connected to the bit line BL was set to about 100 mV. All these numerical values satisfy the expression (11). It is understood from FIG. 6 that the bit line voltage difference $(V_{B1}-V_{B0})$ between the cases of the data "1" and the data "0" is equal to about 610 mV and sufficiently greater than the detection limit voltage $V_S$ of about 100 mV. Thus, it has been possible to confirm that the difference between the cases of the data "0" and the data "1" can be sufficiently detected by setting the bit line capacitance $C_B$ to satisfy the conditions of the above expression (11).

When a memory cell holds data "1", a voltage $(V_R-V_{B1})$ applied to a ferroelectric film is about 0.6 V, which is less than a coercive voltage causing polarization inversion of a ferroelectric film (about 0.9 V). In this case, the ferroelectric film is not polarization-inverted, and hence polarization fatigue/deterioration can be remarkably suppressed. In the case of the data "0", no polarization inversion takes place upon application of a voltage exceeding the coercive voltage.

According to the first embodiment, as hereinabove described, the bit line capacitance $C_B$ is set to satisfy the above expression (11) so that the bit line potential difference $(V_{B1}-V_{B0})$ between the cases of the data "1" and the data "0" can be in excess of the detection limit voltage $V_S$, whereby the read margin can be increased. Thus, it is possible to effectively suppress false data reading or the like.

According to the aforementioned first embodiment, further, the electric capacitances $C_{f0}$ and $C_{f1}$ of the ferroelectric capacitor 2 holding the data "0" and the data "1" respectively are set to substantially satisfy the relation $C_B=(C_{f0} \cdot C_{f1})^{1/2}$ so that the bit line potential difference corresponding to the difference between the electric capacitances $C_{f0}$ and $C_{f1}$ of the ferroelectric capacitor 2 can be maximized, whereby the read margin can be further increased.

According to the aforementioned first embodiment, in addition, the ferroelectric film can be prevented from polarization inversion when reading the data "1" by setting the voltage $(V_R-V_{B1})$ applied to the ferroelectric film in the case of the data "1" below a voltage causing polarization inversion of the ferroelectric film (coercive voltage). Thus, a structure capable of increasing the read margin with no polarization inversion can be obtained in a simple matrix ferroelectric memory.

Second Embodiment

Figure 7:
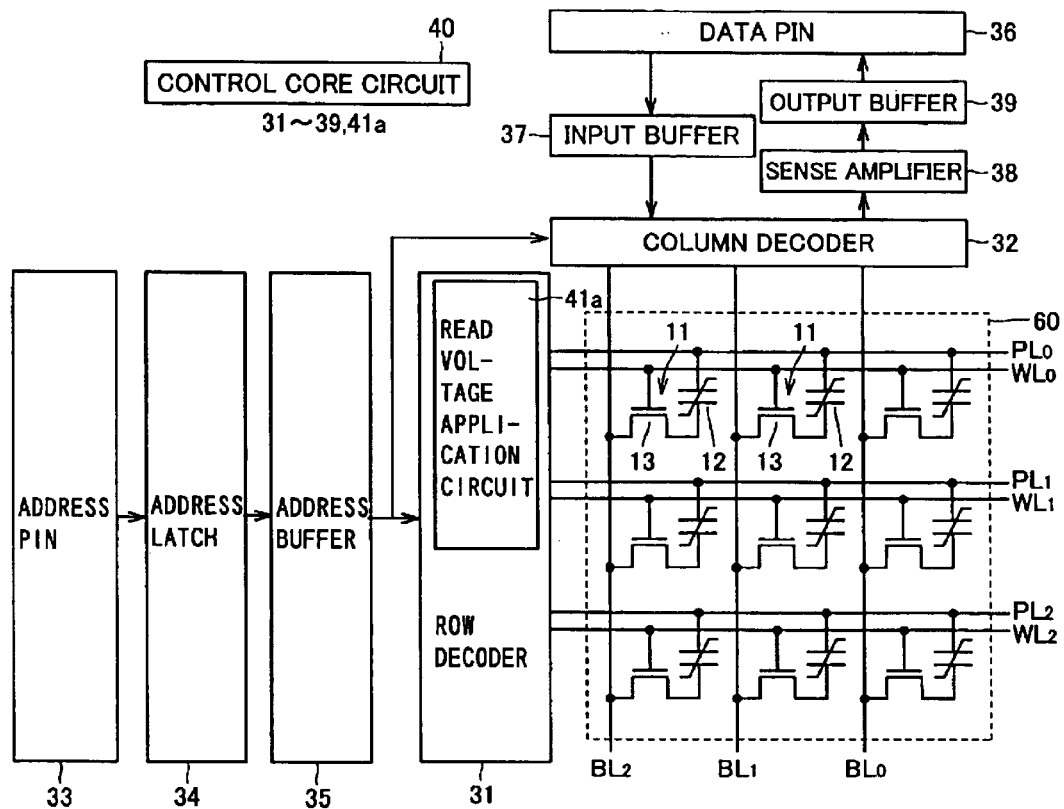
FIG. 7 is a circuit diagram showing the overall structure of a 1T1C ferroelectric memory according to a second embodiment of the present invention.
Figure 8:
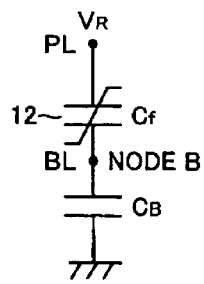
FIG. 8 is an equivalent circuit in a read operation of the ferroelectric memory according to the second embodiment shown in FIG. 7.

Referring to FIGS. 7 and 8, a second embodiment of the present invention is applied to a 1T1C ferroelectric memory.

According to the second embodiment, a memory cell array 60 is constituted of a plurality of memory cells 11 arranged in the form of a matrix, as shown in FIG. 7 (for the convenience of illustration, FIG. 7 shows only nine memory cells 11). Each memory cell 11 is constituted of a single ferroelectric capacitor 12 and a single switching transistor 13. A first electrode of the ferroelectric capacitor 12 is connected to any of plate lines $PL_0$ to $PL_2$ while a second electrode thereof is connected to either one of source/drain regions of the switching transistor 13. The other source/drain region of the switching transistor 13 is connected to any of bit lines $BL_0$ to $BL_2$. The gate electrode of the switching transistor 13 is connected to any of word lines $WL_0$ to $WL_2$.

A row decoder 31 stores a read voltage application circuit 41a for applying a read voltage $V_R$ to the plate lines $PL_0$ to $PL_2$. The read voltage application circuit 41a is an example of the "means applying a read voltage $V_R$" in the present invention. The remaining structure of the second embodiment is identical to that of the first embodiment shown in FIG. 1.

FIG. 8 illustrates an equivalent circuit in a case of setting the word lines $WL_0$ to $WL_2$ to high levels for bringing each switching transistor 13 into an ON state in a data read operation in each memory cell 11 of the ferroelectric memory according to the second embodiment shown in FIG. 7. In this memory cell 11, the read voltage application circuit 41a shown in FIG. 7 applies the read voltage $V_R$ to each plate line PL, so that a voltage sense amplifier 38 detects potential difference $(V_{B1}-V_{B0})$ of each bit line BL (node B) similarly to the aforementioned first embodiment. Thus, data is read from the memory cell 11.

As shown in FIG. 8, the equivalent circuit of the 1T1C ferroelectric memory according to the second embodiment in data reading is similar to that of the first embodiment shown in FIG. 2. Also in the 1T1C ferroelectric memory according to the second embodiment, therefore, it is possible to increase a read margin with no polarization inversion by applying the above expression (11) and reducing a voltage applied to a ferroelectric film below a coercive voltage causing polarization inversion of a ferroelectric film when the memory cell 11 holds data "1".

Third Embodiment

Figure 9:
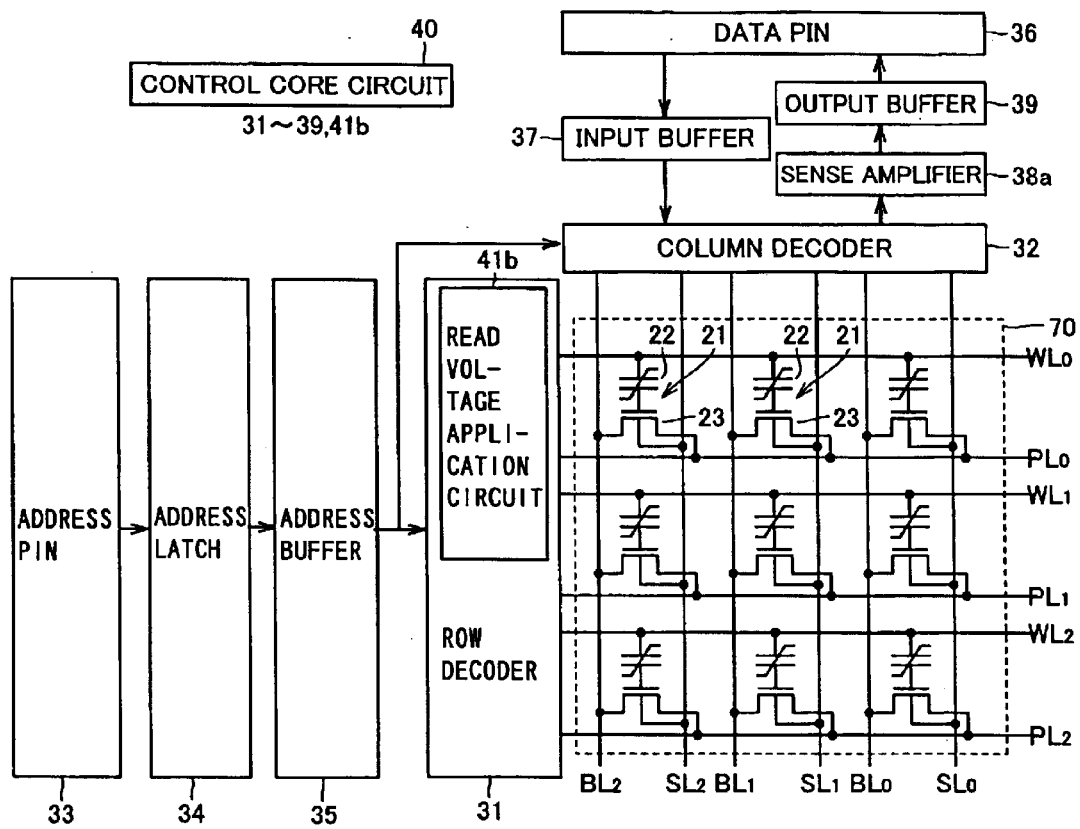
FIG. 9 is a circuit diagram showing the overall structure of an FET ferroelectric memory according to a third embodiment of the present invention.
Figure 10:
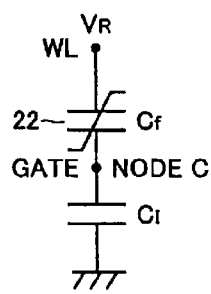
FIG. 10 is an equivalent circuit in a read operation of the ferroelectric memory according to the third embodiment shown in FIG. 9.
Figure 11:
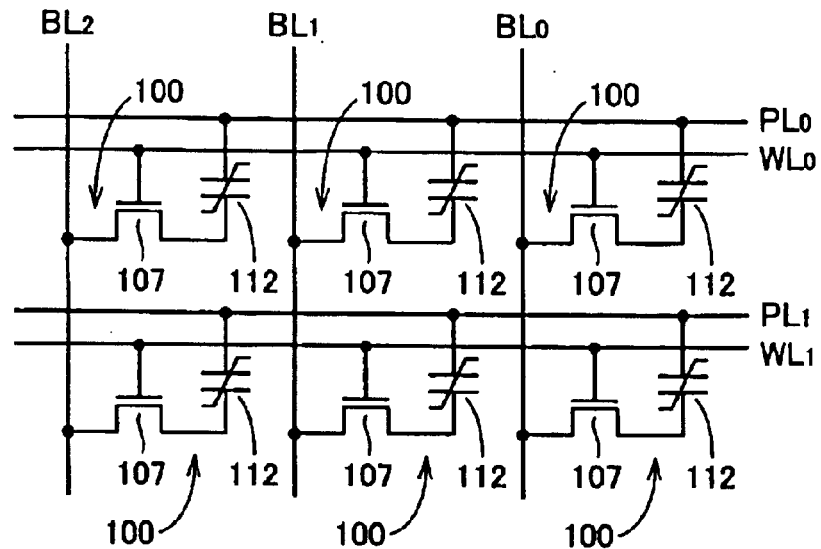
FIG. 11 is a circuit diagram of a conventional 1T1C ferroelectric memory.
Figure 12:
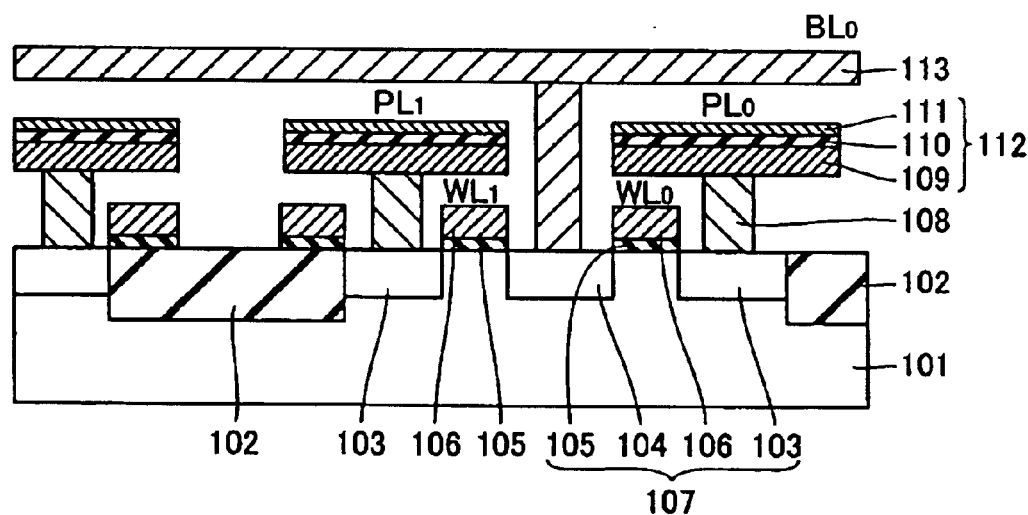
FIG. 12 is a sectional view of the conventional 1T1C ferroelectric memory shown in FIG. 11.
Figure 13:
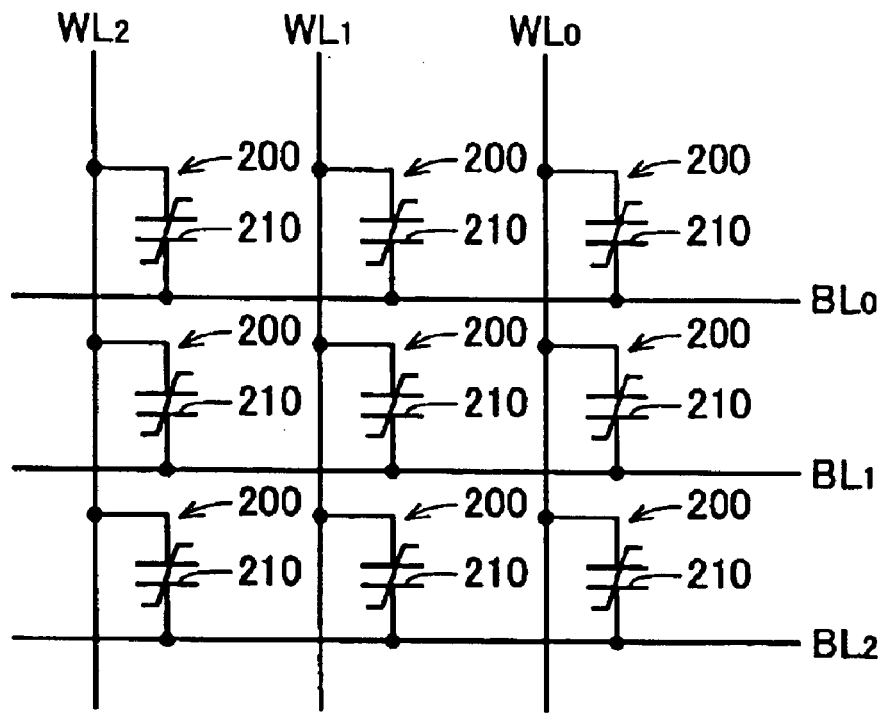
FIG. 13 is a circuit diagram showing a conventional simple matrix ferroelectric memory.
Figure 14:
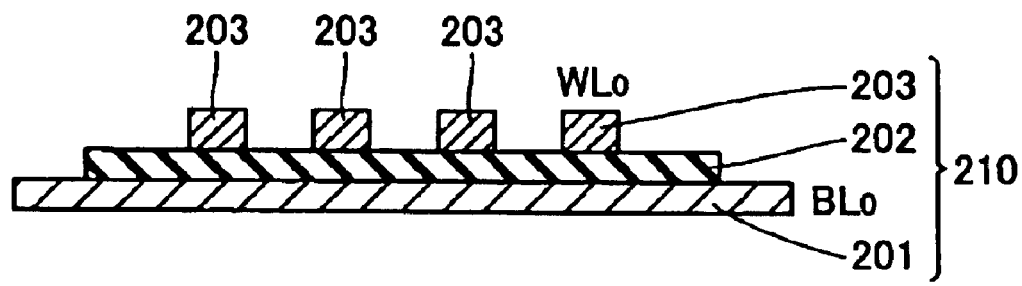
FIG. 14 is a sectional view of the conventional simple matrix ferroelectric memory shown in FIG. 13.
Figure 15:
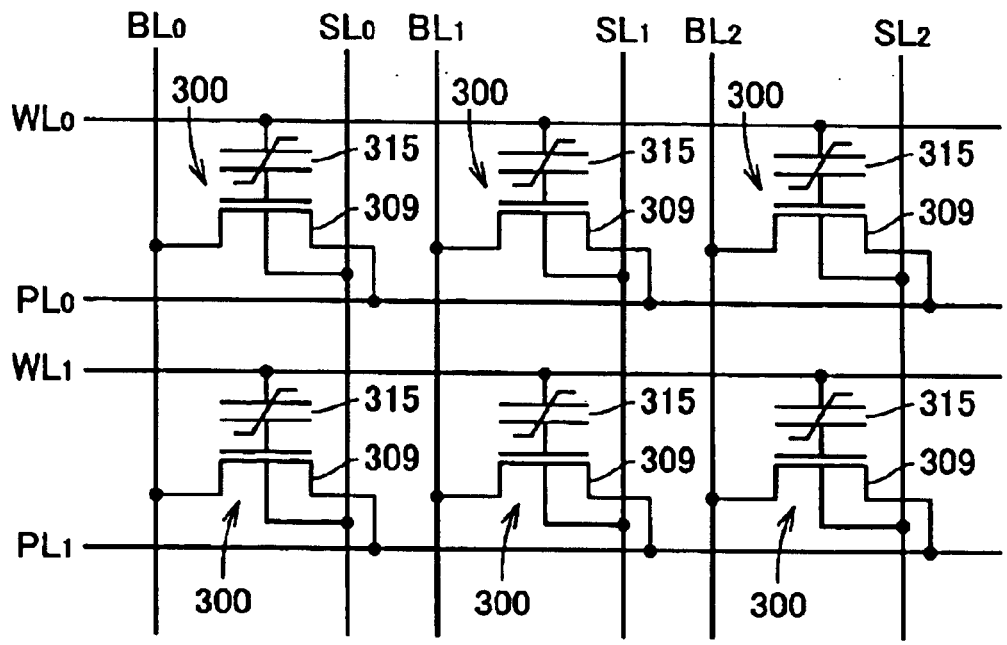
FIG. 15 is a circuit diagram of a conventional FET (MFMIS-FET) ferroelectric memory.
Figure 16:
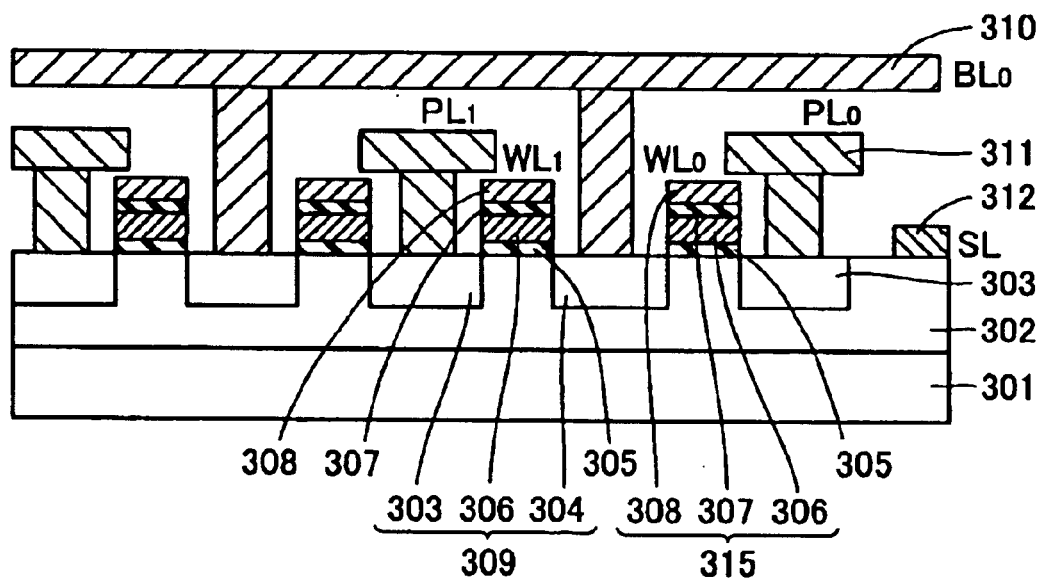
FIG. 16 is a sectional view of the conventional FET ferroelectric memory shown in FIG. 15.

Referring to FIGS. 9 and 10, a third embodiment of the present invention is applied to an FET ferroelectric memory.

In the FET ferroelectric memory according to the third embodiment, a memory cell array 70 is constituted of a plurality of memory cells 21 arranged in the form of a matrix (for the convenience of illustration, FIG. 9 shows only nine memory cells 21). Each memory cell 21 is constituted of a single transistor (FET) 23 and a ferroelectric capacitor 22 formed on the gate portion of the transistor 23. A first electrode of the ferroelectric capacitor 22 is connected to any of word lines $WL_0$ to $WL_2$ while a second electrode thereof is connected to the gate electrode of the transistor 23. One of source/drain regions of the transistor 23 is connected to any of bit lines $BL_0$ to $BL_2$, and the other source/drain region is connected to any of plate lines $PL_0$ to $PL_2$. A channel region (well region) of the transistor 23 is connected to any of source lines $SL_0$ to $SL_2$.

According to the third embodiment, a row decoder 31 is provided with a read voltage application circuit 41b for applying a read voltage $V_R$ to the word lines $WL_0$ to $WL_2$. The read voltage application circuit 41b is an example of the "means applying a read voltage $V_R$" in the present invention. A current sense amplifier 38a is connected to the bit lines $BL_0$ to $BL_2$ through a column decoder 32. The sense amplifier 38a is an example of the "detection means capable of detecting the difference between the electric capacitances $C_{f0}$ and $C_{f1}$ of said ferroelectric film" in the present invention. The remaining structure of the third embodiment is identical to that of the first embodiment shown in FIG. 1.

FIG. 10 illustrates an equivalent circuit in data reading from each memory cell 21 of the FET ferroelectric memory according to the third embodiment shown in FIG. 9. Referring to FIG. 10 symbol $C_I$ denotes the electric capacitance of the gate electrode of each MIS transistor 23. The electric capacitance $C_I$ of the gate electrode is an example of the "electric capacitance $C_2$ of said second electrode" in the present invention. In data reading, the current sense amplifier 38a reads the value of a current flowing to the MIS transistor 23 varying with potential difference of a node C.

As shown in FIG. 10, the equivalent circuit of the FET ferroelectric memory according to the third embodiment in data reading is similar to that of the first embodiment shown in FIG. 2. Also in the FET ferroelectric memory according to the third embodiment, therefore, it is possible to increase a read margin with a reading method causing no polarization inversion by substituting the electric capacitance $C_I$ of the gate electrode for the bit line capacitance $C_B$ in the above expression (11) for satisfying the above expression (11) while setting a voltage applied to a ferroelectric film less than a coercive voltage causing polarization inversion of a ferroelectric film when the memory cell 21 holds data "1".

Although the present invention has been described and illustrated in detail, it is clearly understood that the same is by way of illustration and example only and is not to be taken by way of limitation, the spirit and scope of the present invention being limited only by the terms of the appended claims.

For example, while an SBT film ($SrBi_2Ta_2O_9$ film) is employed as the ferroelectric film in the aforementioned first embodiment, the present invention is not restricted to this but a ferroelectric film of $SrBi_2(Nb,Ta)_2O_9$ (SBNT), $Pb(Zr,Ti)O_3$ (PZT), $(Pb,La)(Zr,Ti)O_3$ (PLZT), $(Bi,La)_4Ti_3O_{12}$ (BLT) or $Bi_4Ti_3O_{12}$ (BIT) or a material following this is alternatively employable.

What is claimed is:

1. A ferroelectric memory comprising:
   a memory cell including a ferroelectric capacitor having a ferroelectric film capable of taking different electric capacitances $C_{f0}$ and $C_{f1}$ in an initial state and first and second electrodes formed to hold said ferroelectric film therebetween;
   a circuit applying a read voltage $V_R$ to said first electrode; and
   a detector capable of detecting the difference between the electric capacitances $C_{f0}$ and $C_{f1}$ of said ferroelectric film when the potential difference of said second electrode corresponding to the difference between the electric capacitances $C_{f0}$ and $C_{f1}$ of said ferroelectric film is in excess of a detection limit voltage $V_S$, wherein
   the electric capacitance $C_2$ of said second electrode is set to satisfy the following expression:

$$C_{f0} < C_2 \leq \tfrac{1}{2} \times \{(C_{f1}-C_{f0})V_R/V_S - (C_{f1}+C_{f0})\}.$$

2. The ferroelectric memory according to claim 1, wherein
   the electric capacitance $C_2$ of said second electrode is substantially expressed as follows:

$$C_2 = (C_{f1} \times C_{f0})^{1/2}.$$

3. The ferroelectric memory according to claim 1, wherein
   a voltage applied to said ferroelectric film is less than a voltage causing polarization inversion of said ferroelectric film when holding data in a polarization direction opposite to the direction of application of said read voltage in data reading.

4. The ferroelectric memory according to claim 3, wherein
   said voltage applied to said ferroelectric film is greater than said voltage causing polarization inversion of said ferroelectric film when holding data in a polarization direction identical to the direction of application of said read voltage in data reading.

5. The ferroelectric memory according to claim 1, wherein
said memory cell includes a memory cell having said second electrode connected with a gate electrode of a transistor.

6. The ferroelectric memory according to claim 5, wherein
said detector includes a current sense amplifier.

7. The ferroelectric memory according to claim 5, wherein
said first electrode is connected to a word line.

8. The ferroelectric memory according to claim 3, wherein
said memory cell includes a memory cell comprising a ferroelectric capacitor consisting of said first electrode and said second electrode formed to extend in directions intersecting with each other and said ferroelectric film arranged between said first electrode and said second electrode.

9. The ferroelectric memory according to claim 8, wherein
said detector includes a voltage sense amplifier.

10. The ferroelectric memory according to claim 8, wherein
said first electrode is a word line, and
said second electrode is a bit line.

11. The ferroelectric memory according to claim 3, wherein
said memory cell includes a memory cell having said second electrode connected to either a source region or a drain region of a transistor.

12. The ferroelectric memory according to claim 11, wherein
said detector includes a voltage sense amplifier.

13. The ferroelectric memory according to claim 11, wherein
said first electrode is connected to a plate line.

14. The ferroelectric memory according to claim 1, further comprising a row decoder selecting said first electrode corresponding to a row address,
said row decoder including said circuit applying said read voltage $V_R$ to said first electrode.

15. The ferroelectric memory according to claim 1, wherein
said initial state is an initial state applying no voltage.

16. A ferroelectric memory comprising:
a memory cell including a ferroelectric capacitor having a ferroelectric film capable of taking different electric capacitances $C_{f0}$ and $C_{f1}$ in an initial state and first and second electrodes formed to hold said ferroelectric film therebetween;
means applying a read voltage $V_R$ to said first electrode; and
detection means capable of detecting the difference between the electric capacitances $C_{f0}$ and $C_{f1}$ of said ferroelectric film when the potential difference of said second electrode corresponding to the difference between the electric capacitances $C_{f0}$ and $C_{f1}$ of said ferroelectric film is in excess of a detection limit voltage $V_s$, wherein
the electric capacitance $C_2$ of said second electrode is set to satisfy the following expression:

$$C_{f0} < C_2 \leq \tfrac{1}{2} \times \{(C_{f1}-C_{f0})V_R/V_S - (C_{f1}+C_{f0})\}.$$

17. The ferroelectric memory according to claim 16, wherein
the electric capacitance $C_2$ of said second electrode is substantially expressed as follows:

$$C_2 = (C_{f1} \times C_{f0})^{1/2}.$$

18. The ferroelectric memory according to claim 16, wherein
a voltage applied to said ferroelectric film is less than a voltage causing polarization inversion of said ferroelectric film when holding data in a polarization direction opposite to the direction of application of said read voltage in data reading.

19. The ferroelectric memory according to claim 16, wherein
said memory cell includes a memory cell having said second electrode connected with a gate electrode of a transistor.

20. The ferroelectric memory according to claim 18, wherein
said memory cell includes a memory cell comprising a ferroelectric capacitor consisting of said first electrode and said second electrode formed to extend in directions intersecting with each other and said ferroelectric film arranged between said first electrode and said second electrode.

21. The ferroelectric memory according to claim 18, wherein
said memory cell includes a memory cell having said second electrode connected to either a source region or a drain region of a transistor.

22. The ferroelectric memory according to claim 16, wherein
said initial state is an initial state applying no voltage.

* * * * *